(12) United States Patent
Sasano et al.

(10) Patent No.: US 6,606,198 B2
(45) Date of Patent: Aug. 12, 2003

(54) LENS ARRAY

(75) Inventors: Tomohiko Sasano, Osaka (JP);
Yasuhiro Tanaka, Hyogo (JP);
Michihiro Yamagata, Osaka (JP);
Yoshikazu Sano, Osaka (JP); Tomoko Komatsu, Kyoto (JP); Michiyo Ichikawa, Kyoto (JP); Sumio Terakawa, Osaka (JP); Hiromitu Aoki, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/817,772

(22) Filed: Mar. 26, 2001

(65) Prior Publication Data

US 2001/0036014 A1 Nov. 1, 2001

(51) Int. Cl.⁷ ............................................. G02B 27/10
(52) U.S. Cl. ....................................................... 359/619
(58) Field of Search ................................ 359/619, 625, 359/626, 628; 250/216

(56) References Cited

U.S. PATENT DOCUMENTS 5,466,926 A * 11/1995 Sasano et al. ............... 250/216
5,867,321 A * 2/1999 Nakama et al. ............. 359/619
6,163,407 A * 12/2000 Okazaki et al. ............. 359/619

* cited by examiner

Primary Examiner—Georgia Epps
Assistant Examiner—Gary O'Neill
(74) Attorney, Agent, or Firm—Merchant & Gould, P.C.

(57) ABSTRACT

In a lens array, a multiplicity of condenser lenses, each in a convex lens form, are arrayed in vertical and horizontal directions so as to correspond to pixel regions, respectively, and each condenser lens, when viewed from a direction perpendicular to a condenser lens-arrayed plane, takes a planar shape formed with a four straight sides along four sides of the pixel region and four circular arcs extending between the respective straight sides. A center of the four circular arcs substantially coincides with a center of the corresponding pixel region. This ensures an increase in area covered with the condenser lens in the pixel region, thereby causing more light rays to enter the condenser lens. In addition, a radius of curvature necessary for collecting can be obtained more easily. Consequently, light rays can be efficiently collected and guided to light receiving sections or the like provided in the pixel regions. Accordingly, sensitivity is improved when such a lens array is used in a solid-state imaging element, while luminance of a screen is improved when it is used in a panel display element. Besides, such a lens array is easily manufactured.

23 Claims, 7 Drawing Sheets

LENS ARRAY

BACKGROUND OF THE INVENTION

1. Field of the Invention

The present invention relates generally to a lens array used in, for instance, a solid-state imaging element or a panel display element. The present invention further relates to a solid-state imaging element and a panel display element, each of which is provided with a lens array.

2. Related Background Art

The following description will depict a typical conventional solid-state imaging element.

FIG. 6 is a cross-sectional view illustrating a schematic configuration of a typical solid-state imaging element.

Generally, a solid-state imaging element includes, as shown in FIG. 6, an n-type semiconductor substrate 312, a p-type well layer 311, light receiving sections 310, charge transfer sections 309, a film 307 made of either silicon oxide or silicon nitride, polysilicon electrodes 308, metal light-shielding layers 306, an element-surface protective layer 305, a flattening film 304, a color filter layer 303, an intermediate transparent film 302, and a lens array (on-chip lens) 301. Incidentally, the color filter layer 303 is unnecessary in the case of a three-plate-type imaging element or a monochrome imaging element, or in the case where incident light has already been subjected to color segmentation by another wavelength selecting means.

In a typical solid-state imaging element, light is received by only the light receiving sections 310, while light incident on the other parts makes no contribution to sensitivity. In view of this, a method has been well known, as one of techniques for providing higher sensitivity, in which a lens array 301 is formed on the light receiving sections 310 to condense beams of light and direct them to the light receiving sections 310.

Lenses of the lens array 301 are disposed at positions corresponding to the light receiving sections 310, respectively, and by utilizing the light collecting effect of each lens, the light entering the same is efficiently guided toward each light receiving section 310.

FIGS. 7A and 7B illustrate a configuration of a conventional lens array. FIG. 7A is a plan view of the lens array 301 viewed from above, and FIG. 7B is a cross-sectional view taken on line VIIB—VIIB in FIG. 7A, viewed from the arrow direction. A region corresponding to one pixel (hereinafter occasionally referred to as a "pixel region") is a region defined by vertical sides 355 and horizontal sides 354. The lens 301 is provided substantially at the center of the foregoing region to contribute to the improvement in sensitivity. Here, spaces 353 are provided between adjacent lenses from the viewpoint of manufacture. Incidentally, though only four pixels are shown in FIGS. 7A and 7B for simplification of the drawings, predetermined numbers of pixels shown in FIG. 7A actually are aligned in the vertical and horizontal directions, respectively.

In the foregoing lens array, each lens is substantially round or elliptic in planar shape and has a diameter not exceeding a length of one side of the pixel-corresponding region. Therefore, the spaces 353 produced in the manufacturing process are present in each of the lens-alignment directions. Further, in each tetragonal pixel region, there also are spaces at corners where the lens 301 is not formed. Light incident on these portions hardly enters the light receiving sections, hence making substantially no contribution to the sensitivity.

Likewise, a lens array having spaces as shown in FIGS. 7A and 7B is laminated in a fashion such that each lens should correspond to each pixel, in a panel display element used in a transparent-type liquid crystal display as well. However, light entering the foregoing spaces does not contribute to the luminance of a screen of the liquid crystal display.

SUMMARY OF THE INVENTION

Therefore, with the foregoing in mind, it is an object of the present invention to provide a lens array arranged, for example, so as to include lenses each having a greater aperture and a sufficient curvature for collecting light, so that the lens array, for instance, can achieve improvements in sensitivity when used in a solid-state imaging element, and improvements in luminance of a screen when used in a panel display element.

In order to achieve the aforementioned object, a lens array of the present invention has the following configuration.

Namely, a lens array according to a first configuration of the present invention includes a plurality of condenser lenses arrayed in vertical and horizontal directions so that the condenser lenses and pixels arrayed in a two-dimensional plane have one-to-one correspondence. The lens array is characterized in that each of the condenser lenses, when viewed from a direction perpendicular to a condenser lens-arrayed plane, has a planar shape formed with four straight sides and four approximate circular arcs extending between the respective straight sides, and the center of the four approximate circular arcs substantially coincides with the center of a region corresponding to the pixel.

The lens array according to the first configuration ensures efficient utilization of each pixel region, thereby increasing the aperture of the condenser lens and reducing the loss of light passing through the pixel regions. This results in, for instance, improvement of sensitivity when the lens array is used in a solid-state imaging element, and improvement of luminance of a screen when the lens array is used in a panel display element. In addition, it is relatively easy to manufacture lenses in the aforementioned shape.

In the first configuration, it is preferable that the pixel-corresponding region be rectangular (either rectangular or square) in shape, and that a diameter of the approximate circular arcs be shorter than a diagonal of the region while being longer than a short side of the region (a vertical or horizontal side of the region in case it is square). The foregoing preferable configuration allows a proportion of a condenser-lens-provided area in the pixel region to increase, thereby causing the condenser lens to have a larger aperture.

Furthermore, in the first configuration, it is preferable that the pixel-corresponding region be rectangular (either rectangular or square) in shape, and that the condenser lens has a substantially equal curvature in diagonal and side directions in the region. The foregoing preferable configuration allows a lens array having a multiplicity of condenser lenses arrayed in the vertical and horizontal directions to be formed through a simple process described later.

Furthermore, in the first configuration, it is preferable that the pixel-corresponding region be rectangular (either rectangular or square) in shape, and that a radius of curvature R of the condenser lens satisfies:

$$X/2 \leq R \leq (\tfrac{1}{2}) \times (X^2 + Y^2)^{1/2} \qquad (1)$$

where X and Y represent a length of a short side and a length of a long side of the region, respectively (X=Y when the foregoing region is square), in either a vertical or horizontal direction in the region.

The foregoing preferable configuration allows a proportion of a condenser-lens-provided area in the pixel region to increase, thereby causing the condenser lens to have a larger aperture.

A lens array according to a second configuration of the present invention includes a plurality of condenser lenses arrayed in vertical and horizontal directions so that the condenser lenses and pixels arrayed in a two-dimensional plane have one-to-one correspondence. The lens array is characterized in that each of regions corresponding to the pixels, respectively, is rectangular in shape, and a short side of the region is not longer than ½ of a long side of the same, that each of the condenser lenses, when viewed from a direction perpendicular to a condenser lens-arrayed plane, has a planar shape formed with two straight sides opposing each other substantially in parallel and two approximate circular arcs extending between the straight sides, and further, that a center of the two approximate circular arcs substantially coincides with a center of the pixel-corresponding region.

The foregoing lens array according to the second configuration ensures efficient utilization of each pixel region in the case where the array pitch of the pixels in the vertical direction differs from that in the horizontal direction, thereby increasing an aperture of the condenser lens and reducing the loss of light passing through the pixel regions. This results in, for instance, improvement in sensitivity when the lens array is used in a solid-state imaging element, and improvement in luminance of a screen when the lens array is used in a panel display element. In addition, it is relatively easy to manufacture lenses in the aforementioned shape.

In the first or second configuration, it is preferable that side surfaces of the condenser lens that respectively include the straight sides of the planar shape of the condenser lens not be perpendicular to the condenser lens-arrayed plane. With the foregoing preferable configuration, when used in a solid-state imaging element, it also is possible to guide light entering the side surfaces efficiently to the light receiving sections. Furthermore, when an angle of tilt of the side surfaces is selected with a manufacturing method taken into consideration, an easily manufacturable lens array can be obtained.

In the first or second configuration, it is preferable that the pixel-corresponding region be rectangular (either rectangular or square) in shape, and that a short side of the rectangular region (one side of the region when it is square) be not more than 5 μm long, and more preferably not more than 3.5 μm long. The foregoing preferable configuration facilitates manufacture of the condenser lens whose radii of curvature in the diagonal and side directions of the foregoing region are substantially equal to each other.

Furthermore, in the first or second configuration, the condenser lens preferably is not more than 2 μm high, and more preferably not more than 1 μm high. The foregoing preferable configuration facilitates manufacture of the condenser lens whose radii of curvature in the diagonal and side directions of the foregoing region are substantially equal to each other.

Furthermore, in the first or second configuration, the condenser lens preferably is formed in a binary shape obtained by approximation of its shape to a step-like shape. The foregoing preferable configuration allows more alternatives of lens array manufacturing methods to be available, thereby enabling simplification of a manufacturing process and cost reduction.

Furthermore, a solid-state imaging element according to the present invention includes light receiving sections arrayed in a two-dimensional plane and the lens array according to the first or second configuration that is laminated on the light receiving sections. The solid-state imaging element is characterized in that the condenser lenses of the lens array and the light receiving sections have one-to-one correspondence. The foregoing configuration ensures that a solid-state imaging element having high sensitivity and being capable of providing sharp images can be provided. In the present invention, the "solid-state imaging element" means a charge coupled device (CCD) or a complementary metal-oxide semiconductor (CMOS).

In the foregoing configuration, a focal length of the condenser lens preferably is substantially equal to a distance therefrom to the light receiving section corresponding thereto. The foregoing preferable configuration ensures that light passing through the condenser lens can be gathered and directed to the light receiving section without loss, thereby increasing a virtual aperture of the condenser lens. Consequently, sharp images can be obtained.

Furthermore, a panel display element in accordance with the present invention includes pixels arrayed in a two-dimensional plane and the lens array according to the first or second configuration that is laminated on the pixels. The panel display element is characterized in that the condenser lenses of the lens array and the pixels have one-to-one correspondence. According to the foregoing configuration, it is possible to obtain a panel display element having improved luminance of a screen and being capable of providing sharp images. In the present invention, the "panel display element" means a liquid crystal display element or an organic electro-luminescence (EL) device.

In the foregoing configuration, a focal length of the condenser lens preferably is substantially equal to a distance therefrom to the pixel corresponding thereto. The foregoing preferable configuration increases a virtual aperture of the condenser lens. Consequently, sharp images can be obtained.

BRIEF DESCRIPTION OF THE DRAWINGS

FIG. 1A is a plan view of the same; FIG. 1B is a cross-sectional view of the same taken on line IB—IB in FIG. 1A, viewed from the arrow direction; and FIG. 1C is a cross-sectional view of the same taken on line IC—IC in FIG. 1A, viewed from the arrow direction.

FIG. 2A is a plan view of the same; FIG. 2B is a cross-sectional view of the same taken on line IIB—IIB in FIG. 2A, viewed from the arrow direction; FIG. 2C is a cross-sectional view of the same taken on line IIC—IIC in FIG. 2A, viewed from the arrow direction; and FIG. 2D is a cross-sectional view of the same taken on line IID—IID in FIG. 2A, viewed from the arrow direction.

FIG. 3A is a plan view of the same; FIG. 3B is a cross-sectional view of the same taken on line IIIB—IIIB in FIG. 3A, viewed from the arrow direction; and FIG. 3C is a cross-sectional view of the same taken on line IIIC—IIIC in FIG. 3A, viewed from the arrow direction.

FIG. 4A is a plan view of the same; and FIG. 4B is a cross-sectional view of the same taken on line IVB—IVB in FIG. 4A, viewed from the arrow direction

FIG. 7A is a plan view of the same; and FIG. 7B is a cross-sectional view of the same taken on line VIIB—VIIB in FIG. 7A, viewed from the arrow direction.

DETAILED DESCRIPTION OF THE INVENTION

Figure 1A:
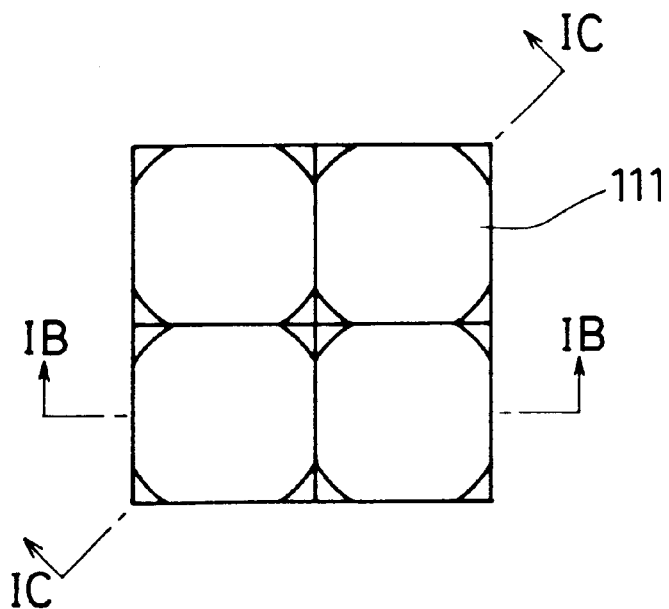
FIGS. 1A through 1C are conceptual views of a lens array according to a first embodiment of the present invention.

The following description will depict a lens array of the present invention in more detail while referring to the drawings.

First Embodiment

Figure 1B:
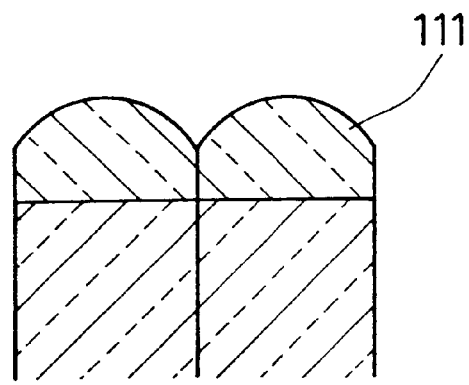
Figure 1C:
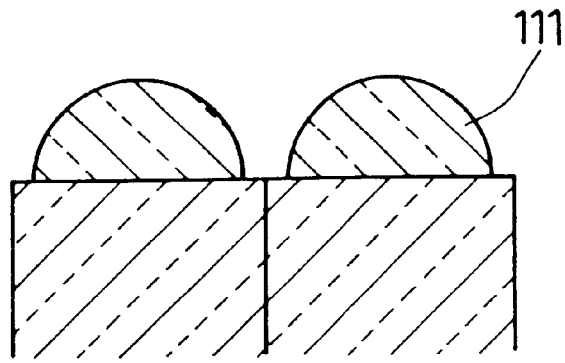

FIGS. 1A through 1C are conceptual views of a lens array according to a first embodiment of the present invention: FIG. 1A is a plan view of the same; FIG. 1B is a cross-sectional view of the same taken on line IB—IB in FIG. 1A, viewed from the arrow direction; and FIG. 1C is a cross-sectional view of the same taken on line IC—IC in FIG. 1A, viewed from the arrow direction.

Incidentally, though only four pixels are shown in FIGS. 1A through 1C for simplification of the drawings, predetermined numbers of pixels shown in FIG. 1A actually are aligned in vertical and horizontal directions, respectively.

In the lens array according to the present embodiment, condenser lenses 111, each in a convex lens shape, are provided in rectangular pixel regions arrayed in the vertical and horizontal directions so that one condenser lens should correspond to one pixel region.

Here, a planar shape of each condenser lens 111 viewed from a direction perpendicular to the condenser lens-arrayed plane is a substantially octagonal shape as shown in FIG. 1A. More precisely, the planar shape of each condenser lens is a deformed octagonal shape formed with four straight sides parallel to or coinciding with four sides defining the rectangular pixel region and four approximate circular arcs, each of which extends between two adjacent sides of the four straight sides. The foregoing four approximate circular arcs are portions of an approximate circle concentric with the foregoing substantially octagonal shape (whose center substantially coincides with the center of the pixel region). A diameter of the foregoing circle is shorter than a diagonal of the pixel region, and longer than one side of the pixel region (in the case where the pixel region is rectangular, longer than its short side).

A radius of curvature of the condenser lens 111 in a cross section (FIG. 1B) taken in parallel with four sides as borders of the pixel region is preferably substantially equal to a radius of curvature of the condenser lens 111 in a cross section (FIG. 1C) taken along a diagonal of the pixel region. More preferably, a surface of each condenser lens 111 constitutes a portion of a spherical surface.

The lens array according to the present embodiment has the configuration as described above, thereby having an increased area of portions covered with the condenser lenses 111 in the pixel regions as compared with the case of a conventional lens. Further, at the same time, the radius of curvature of the condenser lens 111 necessary for collecting light can be selected freely, without being limited by a length of a diagonal of the pixel region and the like.

Figure 6:
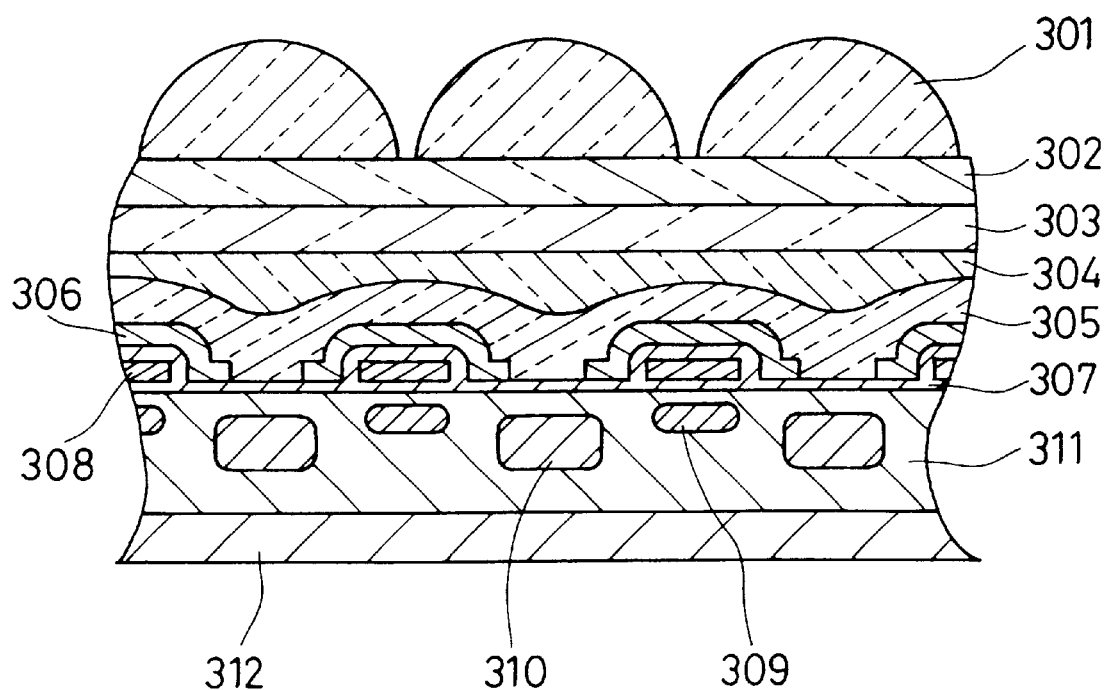
FIG. 6 is a cross-sectional view illustrating a schematic configuration of a typical solid-state imaging element.
Figure 7A:
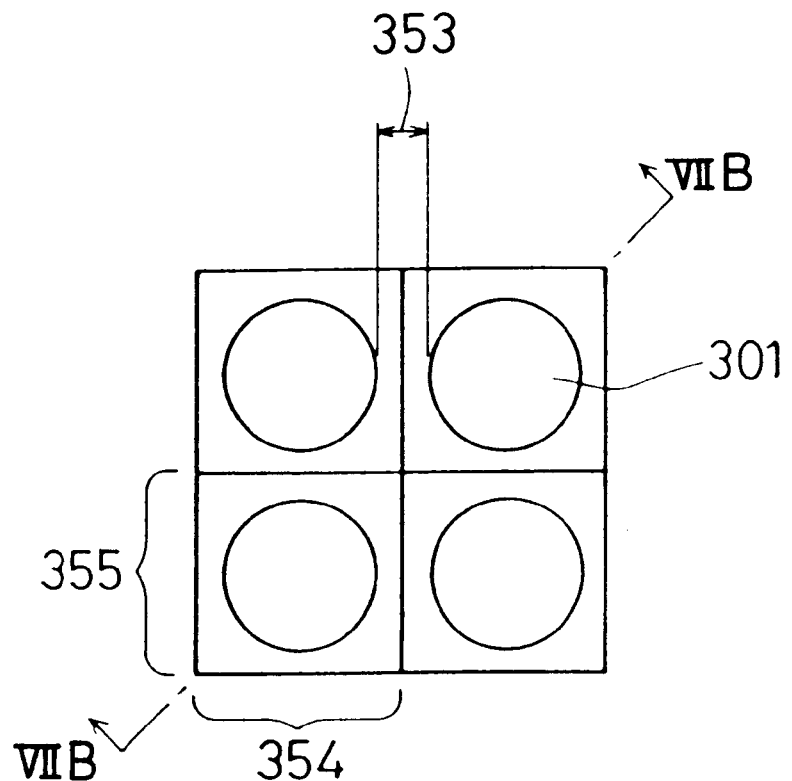
FIGS. 7A and 7B are schematic views of a conventional lens array.
Figure 7B:
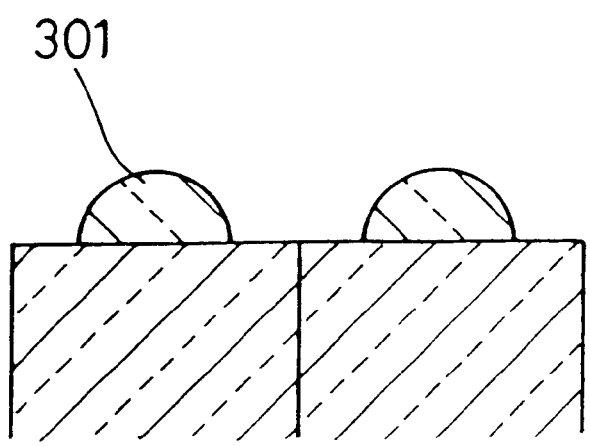

Assume that a solid-state imaging element is configured as shown in FIG. 6 in which: a p-type well layer 311 is provided; light receiving sections 310 with one side length of about 2.5 $\mu$m are formed in portions of the p-type well layer 311 in the vicinity of its surface; then, there are provided an approximately 0.1 $\mu$m-thick silicon oxide film or silicon nitride film 307, an element-surface protective film 305 with a refractive index of 1.55 and a thickness of about 0.9 $\mu$m, a flattening film 304 with a refractive index of 1.47 and a thickness of about 1 $\mu$m, and a color filter layer 303 with a refractive index of 1.52 and a thickness of about 2 $\mu$m; and respective pixel regions corresponding to the light receiving sections 310 are in a square form with each side length of about 4.5 $\mu$m. On top of the pixel regions, condenser lenses 301 with a refractive index of 1.5 are placed. Utilizing this, simulation was carried out.

The lens array according to the present embodiment had a light collecting rate of 90% in the case where the condenser lens thereof had a size of 4.3 $\mu$m (vertical length)×4.3 $\mu$m (horizontal length), a radius of curvature of 3.4 $\mu$m, and a lens thickness of 1.8 $\mu$m. On the other hand, a typical conventional lens array had a light collecting rate of 72% in the case where the condenser lens thereof had a diameter of 4.3 $\mu$m when viewed from above and a radius of curvature of 3 $\mu$m. This proves that the light collecting rate of the present embodiment increased by about 25% as compared with the conventional case.

Here, the light collecting rate is defined as a proportion of the number of light beams entering one light receiving section to that of the light beams incident on a pixel region corresponding to the one light receiving section, when arbitrary light beam tracking is carried out. In the present simulation, however, the angle of incidence of light beams incident onto the pixel region was set to any angle ranging from 0° to 15°.

The radius of curvature of the condenser lens is required to be at least half of the length of the short side of the rectangular pixel region, for instance, to allow the condenser lens to cover more of the pixel region than the conventional lens did. An excessively large radius of curvature, however, causes the light-gathering power to decrease, thereby causing degradation of sensitivity. Hence, the radius of curvature R of the condenser lens preferably satisfies the following expression (1):

$$X/2 \leq R \leq (\tfrac{1}{2}) \times (X^2+Y^2)^{1/2} \qquad (1)$$

where X and Y represent lengths of short and long sides of the pixel region, respectively.

In the case where the radius of curvature R satisfies the foregoing expression (1), the lens covers a larger area of the pixel region while exhibiting a sufficient light gathering power. When the radius of curvature R is below the lower limit indicated by the expression (1), the lens does not cover a large area of the pixel region. On the other hand, when the radius of curvature R exceeds the upper limit indicated by the expression (1), a sufficient light gathering power cannot be obtained.

Second Embodiment

Figure 2A:
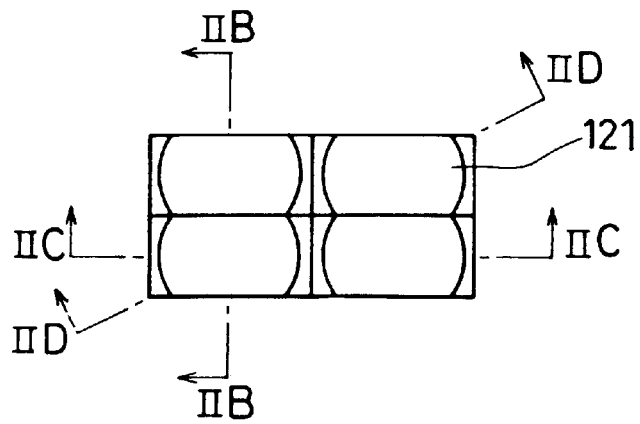
FIGS. 2A through 2D are conceptual views of a lens array according to a second embodiment of the present invention.
Figure 2B:
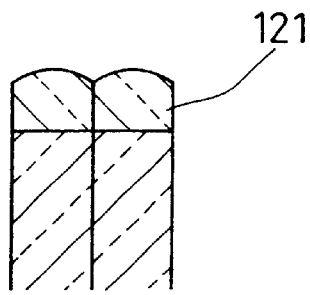
Figure 2C:
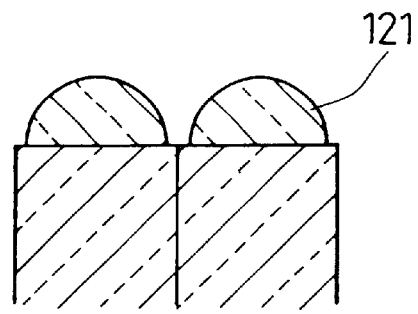
Figure 2D:
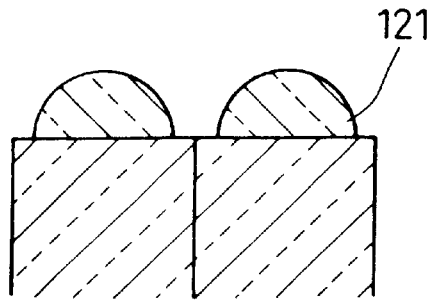

FIGS. 2A through 2D are conceptual views of a lens array according to a second embodiment of the present invention: FIG. 2A is a plan view of the same; FIG. 2B is a cross-sectional view of the same taken on line IIB—IIB in FIG. 2A, viewed from the arrow direction; FIG. 2C is a cross-sectional view of the same taken on line IIC—IIC in FIG. 2A, viewed from the arrow direction; and FIG. 2D is a cross sectional view of the same taken on line IID—IID in FIG. 2A, viewed from the arrow direction.

Incidentally, though only four pixels are shown in FIGS. 2A through 2D for simplification of the drawings, predetermined numbers of pixels shown in FIG. 2A actually are aligned in vertical and horizontal directions, respectively.

A pixel region of the lens array according to the present embodiment has a rectangular shape as is obvious from FIG. 2A. The length of the short side (side in the vertical direction in FIG. 2A) of the rectangular shape is not more than ½ of that of the long side (side in the horizontal direction in FIG. 2A). Condenser lenses 121, each in a convex lens form, are provided on such pixel regions so that one condenser lens should correspond to one pixel region.

Here, a planar shape of the condenser lens 121 viewed from a direction perpendicular to the condenser lens-arrayed plane is a substantially tetragonal shape as shown in FIG. 2A. More precisely, the planar shape is a deformed tetragon formed with two opposed straight sides either parallel to or coinciding with the long sides of the pixel region and two approximate circular arcs extending between the two straight sides. The two approximate circular arcs are portions of an approximate circle concentric with the foregoing tetragon (whose center substantially coincides with the center of the pixel region).

It is preferable that a radius of curvature of the condenser lens 121 in a cross section parallel to the short side of the rectangular pixel region (FIG. 2B), a radius of curvature of the condenser lens 121 in a cross section parallel to the long side thereof (FIG. 2C), and a radius of curvature of the condenser lens 121 in a cross section along a diagonal of the pixel region (FIG. 2D) substantially coincide with one another. More preferably, the surface of each condenser lens 121 constitutes a portion of a spherical surface.

The lens array according to the present embodiment, arranged as described above so that the array pitch of the pixels in the vertical direction differs from that in the horizontal direction, has an increased area of portions covered with the condenser lenses 121 in the pixel regions, as compared with the case of a conventional lens. Therefore, in the case where the lens array is applied to, for instance, a solid-state imaging device, the light collecting rate increases, and the lens array therefore contributes to the improvement in sensitivity.

Third Embodiment

Figure 3A:
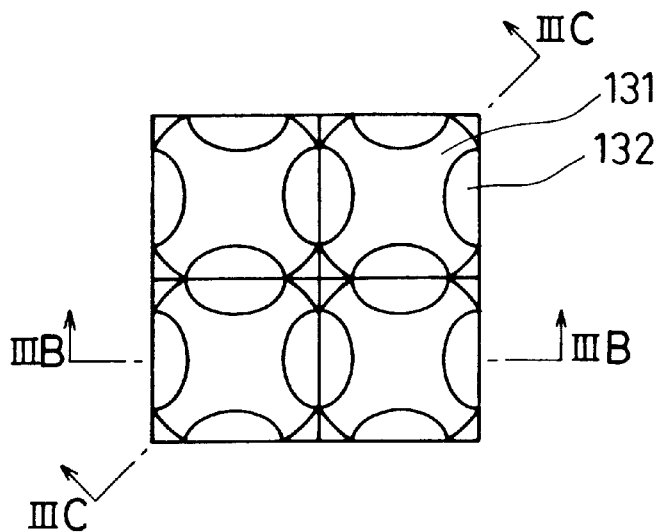
FIGS. 3A through 3C are conceptual views of a lens array according to a third embodiment of the present invention.
Figure 3B:
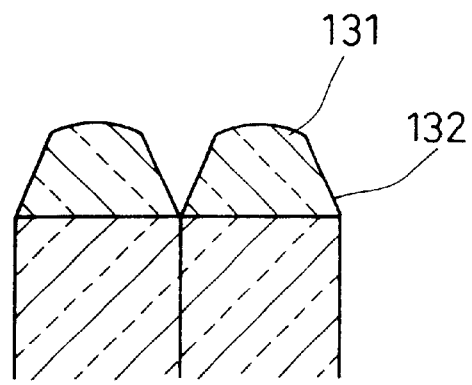
Figure 3C:
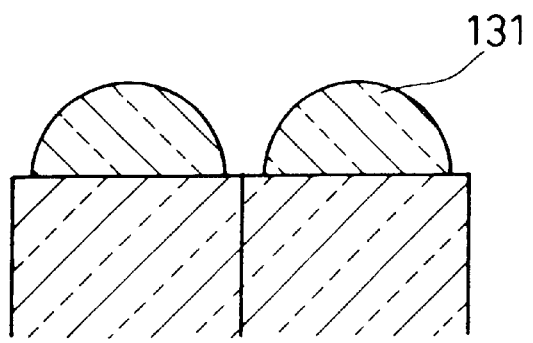

FIGS. 3A through 3C are conceptual views of a lens array according to a third embodiment of the present invention: FIG. 3A is a plan view of the same; FIG. 3B is a cross-sectional view of the same taken on line IIIB—IIIB in FIG. 3A, viewed from the arrow direction; and FIG. 3C is a cross-sectional view of the same taken on line IIIC—IIIC in FIG. 3A, viewed from the arrow direction.

Incidentally, though only four pixels are shown in FIGS. 3A through 3C for simplification of the drawings, predetermined numbers of pixels shown in FIG. 3A actually are aligned in the vertical and horizontal directions, respectively.

A condenser lens 131 according to the present embodiment is obtained through the following modification of the condenser lens 111 depicted in the first embodiment: that is, four lens-side-surfaces 132 including four straight sides (that are either parallel to or coincide with the four sides defining the pixel region), respectively, that define a planar shape of the condenser lens 111 (FIG. 1A) are, not perpendicular to the condenser lens-arrayed plane, but are tilted toward the center of the pixel region at a predetermined angle.

With the configuration as described above, the condenser lens array according to the present embodiment also allows light beams entering the side surfaces 132 to be guided efficiently to the light receiving section when the condenser lens array is applied to, for instance, a solid-state imaging element. In addition, since it is no longer necessary to form the side surfaces 132 perpendicularly, it is possible to provide a lens array that can be manufactured more easily.

Though the lens array according to the first embodiment is taken as an example in the foregoing description, alternatively, lenses with the side surfaces tilted likewise may be formed in the lens array according to the second embodiment. In such a case the same effect as described above can be provided.

Fourth Embodiment

Figure 4A:
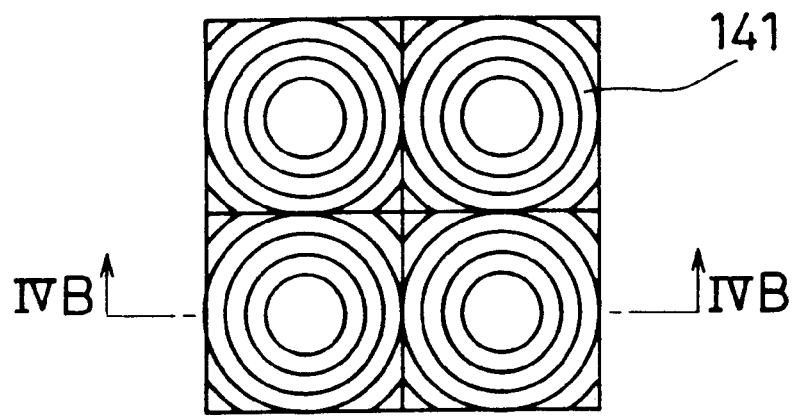
FIGS. 4A and 4B are conceptual views of a lens array according to a fourth embodiment of the present invention.
Figure 4B:
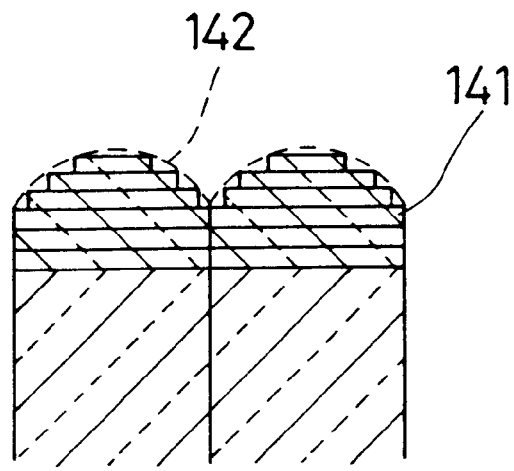

FIGS. 4A and 4B are conceptual views of a lens array according to a fourth embodiment of the present invention: FIG. 4A is a plan view of the same; and FIG. 4B is a cross-sectional view of the same taken on line IVB—IVB in FIG. 4A, viewed from the arrow direction.

Incidentally, though only four pixels are shown in FIGS. 4A and 4B for simplification of the drawings, predetermined numbers of pixels shown in FIG. 4A actually are aligned in the vertical and horizontal directions, respectively.

A condenser lens 141 according the present embodiment is a binary lens obtained by approximating, in a step-like form, the shape of the condenser lens 111 of the lens array according to the first embodiment, and such condenser lenses 141 are provided on rectangular pixel regions arrayed in vertical and horizontal directions, respectively.

The binary shape (stepped shape) is formed so as to approximate closely to an ideal lens shape 142. In this case, performance provided by the binary shape thereof approximates to that provided by the ideal lens shape as the number of the steps in the shape increases.

The use of such a binary lens shape allows more alternatives to be available in the manufacture of the lens array. Specifically, the lens array can be manufactured using, for instance, photolithography.

Though the lens array according to the first embodiment was taken as an example in the foregoing description, binary lenses approximated to the stepped shape likewise may be used in the lens array according to the second or third embodiment. In such a case, the same effect as described above can be provided.

The lens array depicted in each of the foregoing embodiments, when applied to a solid-state imaging element, is preferably formed so that a focal length of each condenser lens of the lens array is substantially equal to a distance therefrom to the light receiving section. Further, when applied to a panel display element, the lens array is preferably formed so that a focal length of each condenser lens of the lens array is substantially equal to a distance therefrom to a pixel of the panel display element. In any of the cases, such a configuration allows sharp images to be obtained.

Fifth Embodiment

The following description will depict an example of a lens array manufacturing method of the present invention.

A case where a lens array is formed on a flattening film of a solid-state imaging element, for instance, is described with reference to FIGS. 5A through 5E.

Figure 5A:
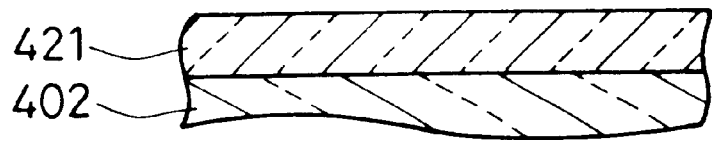
FIGS. 5A through 5E are cross-sectional views schematically illustrating a process for manufacturing a lens array according to a fifth embodiment of the present invention in the step-wise order.

First of all, a synthetic resin layer 421 to be used as a lens material is formed on the flattening film 402 by spin coating (FIG. 5A). Phenol resins, styrene resins, or acrylic resins, for instance, can be used as a material for the synthetic resin layer 421, but other materials conventionally utilized also can be used. Preferable as a material of the synthetic resin layer 421 is specifically a photosensitive resin obtained by adding naphthoquinone diazido to a poly para-vinyl phenol resin. This resin, which can be used as a positive-type resist, comes to have fluidity by response to a heat treatment due to its thermoplastic property, and transforms into a hemispherical shape. Subsequently, shape fixation and solidification are progressed due to the thermosetting property of the resin, whereby the resin can be cured into the lens shape. Furthermore, the photosensitive resin may be subjected to ultraviolet irradiation at a step immediately after a developing step so as to have the visible light transmissivity improved to at least 90%. Then, the photosensitive resin can be transformed into the lens shape in this transparent state.

Figure 5B:
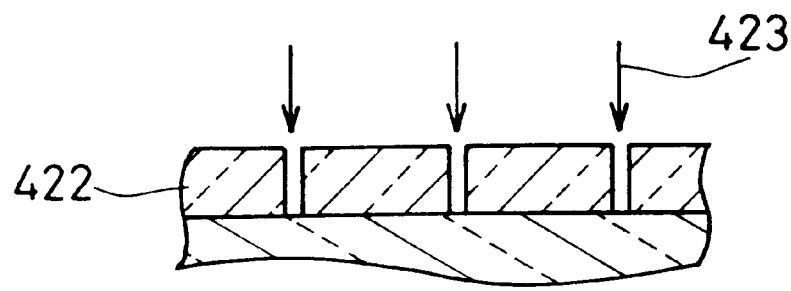

Subsequently, the synthetic resin layer 421 thus formed is selectively exposed. In the case of using a positive-type resist like the aforementioned poly para-vinyl phenol resin, only portions to be removed are irradiated with ultraviolet rays 423, whereby development is carried out. By patterning using such an ultraviolet stepper, the synthetic resin layer 421 is divided into synthetic resin portions 422 that have one-to-one correspondence to the light receiving sections (FIG. 5B).

Figure 5C:
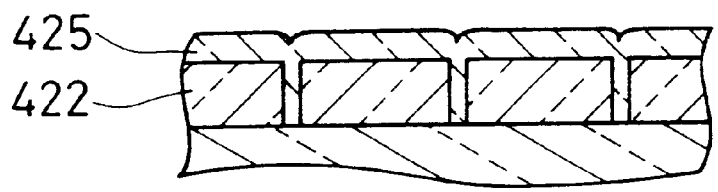

Further, the respective synthetic resin portions 422 thus divided are bleached. More specifically, a non-transparent material is made transparent by ultraviolet irradiation. Thereafter, the synthetic resin portions 422 each having a rectangular cross section are coated with an overcoat layer 425 formed by spin coating or the like (FIG. 5C).

Figure 5D:
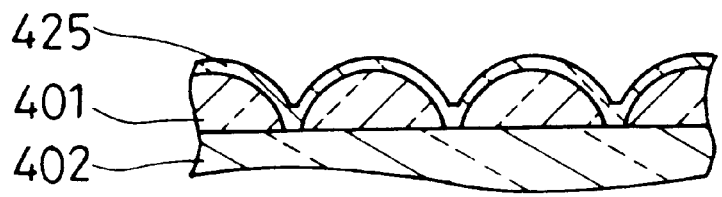

Next, each of the synthetic resin portions 422 coated with the overcoat layer 425 is heated to be softened, so as to be transformed into a dome-like lens form 401 in a convex shape whose cross section in the thickness direction includes an upward curve, by using surface tension (FIG. 5D). Upon this transformation, adjacent synthetic resin portions 422 hardly come into contact with each other because of being coated with the overcoat layer 425. In other words, the overcoat layer 425 exhibits a cushioning effect to prevent the synthetic resin portions 422 from rapidly coming close to each other. Any material may be used as a material for the overcoat layer 425 without particular limitation provided that the material can provide the foregoing cushioning effect. On the other hand, the overcoat layer 425 is required not to completely suppress the transformation of the synthetic resin portions 422 at the temperature for heating the synthetic resin portions 422.

By allowing the overcoat layer 425 to remain as it is, it is possible to form a lens array in which condenser lenses adjacent in the vertical and horizontal directions are in contact with one another. Besides, it also is possible to form a lens so as to cover an entirety of a region corresponding to a pixel, by an identical process to that described above.

Figure 5E:
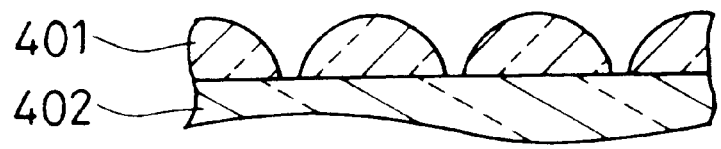

In addition, when the overcoat layer 425 is extremely thin, a lens array in which adjacent condenser lenses 401 are extremely close to one another can be obtained even in the case where the overcoat layer is removed, as shown in FIG. 5E.

Furthermore, either by adjusting the viscosity and thickness of the overcoat layer 425, or by adjusting the heating temperature, four lens side-surfaces parallel with four sides of a rectangular pixel region can be made not perpendicular but tilted with respect to the lens-arrayed plane.

In the foregoing configuration, a length of the short side of the rectangular pixel region (one side of the pixel region in case it is square) in the lens array finally obtained is preferably not more than 5 $\mu$m, and more preferably not more than 3.5 $\mu$m. Furthermore, the condenser lens finally obtained preferably has a height of not more than 2 $\mu$m, or more preferably not more than 1 $\mu$m. In manufacturing a lens array such as would satisfy the foregoing conditions, condenser lenses each in a rotationally symmetric form with respect to each center axis thereof can be obtained easily, due to relatively great surface tension provided upon transformation by heating of the overcoat layer 425 and the synthetic resin portions 422. In other words, condenser lenses in each of which a radius of curvature in the diagonal direction of the pixel region and that in the side direction of the pixel region are substantially equal (or more preferably, condenser lenses each having a spherical surface) can be obtained more easily. Consequently, the condenser lenses obtained have a good light collecting rate.

The embodiments described above merely are intended to clarify technical details of the present invention and the present invention should not be interpreted as being limited to such specific examples. The present invention can be carried out by being modified variously within a range of claims and without departing from its spirit and should be interpreted broadly.

What is claimed is:

1. A lens array comprising a plurality of condenser lenses arrayed in vertical and horizontal directions so that the condenser lenses and pixels arrayed in a two-dimensional plane have one-to-one correspondence, wherein:

each of the condenser lenses, when viewed from a direction perpendicular to the two-dimensional plane in which the condenser lenses are arrayed, has a planar shape formed with four straight sides and four approximate circular arcs extending between the straight sides, respectively, and a center of the four approximate circular arcs substantially coincides with a center of one of regions corresponding to the pixels;

each of the condenser lenses is a refractive lens in a three-dimensional condensing shape formed on a flat substrate.

2. The lens array according to claim 1, wherein:

each of the regions corresponding to the pixels is rectangular in shape; and a diameter of the approximate circular arcs is shorter than a diagonal of the region while being longer than a short side of the region.

3. The lens array according to claim 1, wherein:

each of the regions corresponding to the pixels is rectangular in shape; and each of the condenser lenses has a substantially equal curvature in diagonal and side directions in the region.

4. The lens array according to claim 1, wherein:

each of the regions corresponding to the pixels is rectangular in shape; and a radius of curvature R of each of the condenser lenses satisfies:

$$X/2 \leq R \leq (\frac{1}{2}) \times (X^2 + Y^2)^{1/2} \tag{1}$$

where X and Y represent a length of a short side and a length of a long side of one of the regions, respectively, one of the short and long sides being in the vertical or horizontal direction while the other being in the other direction.

5. A lens array comprising a plurality of condenser lenses arrayed in vertical and horizontal directions so that the condenser lenses and pixels arrayed in a two-dimensional plane have one-to-one correspondence, wherein:

regions corresponding to the pixels, respectively; are rectangular in shape, and a short side of one of the regions is not longer than ½ of a long side of the same; and each of the condenser lenses, when viewed from a direction perpendicular to the two-dimensional plane in which the condenser lenses are arrayed, has a planar shape formed with two straight sides opposing each other substantially in parallel and two approximate circular arcs extending between the straight sides, and a center of the two approximate circular arcs substantially coincides with a center of the one of the regions;

each of the condenser lenses is a refractive lens in a three-dimensional condensing shape formed on a flat substrate.

6. The lens array according to claim 1, wherein side surfaces of each of the condenser lenses that include the straight sides of the planar shape of each of the condenser lenses, respectively, are not perpendicular to the two-dimensional plane in which condenser lenses are arrayed.

7. The lens array according to claim 1, wherein the regions corresponding to the pixels are rectangular in shape, and a short side of each of the regions is not more than 5 $\mu$m long.

8. The lens arrays according to claim 1, wherein the regions corresponding to the pixels are rectangular in shape, and a short side of each of the regions is not more than 3.5 $\mu$m long.

9. The lens array according to claim 1, wherein each of the condenser lenses is not more than 2 $\mu$m high.

10. The lens array according to claim 1, wherein each of the condenser lenses is not more than 1 $\mu$m high.

11. The lens array according to claim 1, wherein each of the condenser lenses is formed in a binary shape obtained by approximation of its shape to a step-like shape.

12. A solid-state imaging element comprising light receiving sections arrayed in a two-dimensional plane and a lens array according to claim 1 that is laminated on the light receiving sections, wherein the condenser lenses of the lens array and the light receiving sections have one-to-one correspondence.

13. The solid-state imaging element according to claim 12, wherein a focal length of each of the condenser lenses is substantially equal to a distance therefrom to one of the light receiving sections corresponding thereto.

14. A panel display element having pixels arrayed in a two-dimensional plane and a lens array according to claim 1 that is laminated on the pixels, wherein the condenser lenses of the lens array and the pixels have one-to-one correspondence.

15. The panel display element according to claim 14, wherein a focal length of each of the condenser lenses is substantially equal to a distance therefrom to one of the pixels corresponding thereto.

16. The lens array according to claim 5, wherein side surfaces of each of the condenser lenses that include the straight sides of the planar shape of each of the condenser lenses, respectively, are not perpendicular to the two-dimensional plane in which condenser lenses are arrayed.

17. The lens array according to claim 5, wherein the regions corresponding to the pixels are rectangular in shape, and a short side of each of the regions is not more than 5 $\mu$m long.

18. The lens arrays according to claim 5, wherein the regions corresponding to the pixels are rectangular in shape, and a short side of each of the regions is not more than 3.5 $\mu$m long.

19. The lens array according to claim 5, wherein each of the condenser lenses is not more than 2 $\mu$m high.

20. The lens array according to claim 5, wherein each of the condenser lenses is not more than 1 $\mu$m high.

21. The lens array according to claim 5, wherein each of the condenser lenses is formed in a binary shape obtained by approximation of its shape to a step-like shape.

22. A solid-state imaging element comprising light receiving sections arrayed in a two-dimensional plane and a lens array according to claim 5 that is laminated on the light receiving sections, wherein the condenser lenses of the lens array and the light receiving sections have one-to-one correspondence.

23. A panel display element having pixels arrayed in a two-dimensional plane and a lens array according to claim 5 that is laminated on the pixels, wherein the condenser lenses of the lens array and the pixels have one-to-one correspondence.

* * * * *